(12) United States Patent
Shiue et al.

(10) Patent No.: US 8,907,739 B2
(45) Date of Patent: Dec. 9, 2014

(54) DIFFERENTIAL SIGNAL LINE STRUCTURE

(75) Inventors: Guang-Hwa Shiue, Chung Li (TW);
Che-Ming Hsu, Chung Li (TW);
Cheng-Fu Hsu, Chung Li (TW)

(73) Assignee: Chung Yuan Christian University, Chung Li (TW)

( * ) Notice: Subject to any disclaimer, the term of this patent is extended or adjusted under 35 U.S.C. 154(b) by 693 days.

(21) Appl. No.: 13/181,609

(22) Filed: Jul. 13, 2011

(65) Prior Publication Data

US 2012/0032749 A1 Feb. 9, 2012

(30) Foreign Application Priority Data

Aug. 4, 2010 (TW) ................................ 99125911 A

(51) Int. Cl.
*H01P 3/08* (2006.01)
*H05K 1/02* (2006.01)
*H03H 1/00* (2006.01)

(52) U.S. Cl.
CPC ................ *H01P 3/08* (2013.01); *H05K 1/0245* (2013.01); *H03H 2001/0085* (2013.01)
USPC ................................ 333/5; 333/185; 333/246

(58) Field of Classification Search
CPC . H01P 3/08; H03H 2001/0085; H05K 1/0245
USPC ............................ 333/4, 5, 12, 181, 185, 246
See application file for complete search history.

(56) References Cited

U.S. PATENT DOCUMENTS

2011/0032048 A1* 2/2011 Wu et al. ........................ 333/12

* cited by examiner

*Primary Examiner* — Benny Lee
*Assistant Examiner* — Rakesh Patel
(74) *Attorney, Agent, or Firm* — Rosenberg, Klein & Lee

(57) ABSTRACT

A differential signal line structure is disposed on a substrate including a signal layer, a filter layer and a grounding layer. The signal layer, the filter layer and the grounding layer are arranged from up to down and in parallel manner. The differential signal line structure accordingly includes a differential signal line group, a first wire and a first grounding circuit; the differential signal line group is disposed in the signal layer; and the first wire is disposed in the filter layer and is arranged in a corresponding position right underneath the differential signal line group. The first grounding circuit is disposed in the grounding layer and is electrically connected to an end point of the first wire through a first via.

4 Claims, 10 Drawing Sheets

DIFFERENTIAL SIGNAL LINE STRUCTURE

This application claims the benefits of the Taiwan Patent Application Serial NO. 099125911 filed on Aug. 4, 2010, the subject matter of which is incorporated herein by reference.

BACKGROUND OF THE INVENTION

1. Field of the Invention

The present invention relates to a signal line structure, and more particularly to a differential signal line structure.

2. Description of the Prior Art

The speed of signal transmission has been improved as the development of technology. At present, the transmission of high speed digital signals is mostly conducted by means of differential signal pair. The high speed digital signals are commonly utilized in the field of Universal Serial Bus 3.0 (USB 3.0), Serial Advanced Technology Attachment (Serial ATA), High-Definition Multimedia Interface (HDMI), Digital Visual Interface (DVI) or radio frequency signal.

In an actual layout of a differential signal line, common mode noise is generated unavoidably due to various reasons and limitations. However, common mode noise causes serious electromagnetic interference (EMI), which should be reduced.

There are many means to reduce the common mode noise generated by the differential signal line, among which nowadays a common mode choke is still commonly utilized in circuits with the working frequency of MHz. Moreover, common mode filters processed by multi-layer substrate and low-temperature co-fire ceramic (LTCC) are also utilized. Even the broadband of an LTCC common mode filter is about 1 GHz; it is still not suitable for the application in high speed/frequency signal circuit. Further, some common mode filters are developed in a direction toward the grounding layer; however, it is not feasible when applied in multi-layer substrates.

Furthermore, electromagnetic band gap (EBG) of a multi-layer substrate is also utilized in common mode filter. Referring to FIGS. 1, 2 and 3, wherein FIG. 1 is an upper view of a common mode filter realized with an EBG of a multi-layer substrate in the prior art; FIG. 2 is a cross-sectional view of a differential signal line structure in the prior art taken along the A-A line of FIG. 1; FIG. 3 is a cross-sectional view of the differential signal line structure in the prior art taken along the B-B line of FIG. 1. In the prior art, a differential signal line 12 is disposed on a layout layer 111 of a substrate 11, a multi-layer substrate 13 is disposed in a filter layer 112 underneath the layout layer 111; the multi-layer substrate 13 is right underneath the differential signal line 12 and is electrically connected to a grounding circuit 15 of a grounding layer 113 through a via 14. As a result, the common mode noise generated by the differential signal line 12 is reduced.

However, it is obvious that the size of the multi-layer substrate 13 is too large to be applied to differential transmission lines, which are arranged in multi-pairs and lately nowadays, regardless of its function of reducing the common mode noise.

SUMMARY OF THE INVENTION

As a result, a differential signal line structure is provided according to the present invention, which is to reduce the common mode noise and also to be utilized in differential transmission lines arranged in multi-pairs that are located closely together.

The differential signal line structure is disposed on a substrate including a signal layer, a filter layer and a grounding layer, wherein the signal layer, the filter layer and the grounding layer are arranged from up to down and in parallel. The differential signal line structure accordingly includes a differential signal line group, a first wire and a first grounding circuit; the differential signal line group is disposed in the signal layer; and the first wire is disposed in the filter layer and is arranged in a corresponding position right underneath the differential signal line group. The first grounding circuit is disposed in the grounding layer and is electrically connected to an end point of the first wire through a first via.

According to an embodiment of the present invention, the differential signal line group includes a first signal line and a second signal line in parallel.

According to the present invention, the differential signal line structure further includes a second wire disposed in the filter layer, wherein the second wire is arranged in a corresponding position right underneath the differential signal line group and the second wire is electrically connected to the first grounding circuit through a second via by an end point.

According to the present invention, the differential signal line structure further includes a second grounding circuit disposed in the filter layer, wherein the second grounding circuit is electrically connected to the first grounding circuit at least through a third via.

Compared with the differential signal line structure of the common mode filter realized with the EBG of the multi-layer substrate in the prior art, the differential signal line structure according to the present invention includes the first wire connecting to the ground with an end disposed right underneath the differential signal line group to form a quarter wave-length resonator and to reduce the common mode noise. Moreover, since the width of the first wire is not a major parameter for reducing the common mode noise, the first wire can maintain its width similar to the width of the differential signal line group and can be utilized in differential transmission lines arranged in multi-pair and closely together.

BRIEF DESCRIPTION OF THE DRAWINGS

Other features and advantages of this invention will become more apparent in the following detailed description of the preferred embodiments of this invention, with reference to the accompanying drawings, in which.

DETAILED DESCRIPTION OF THE PREFERRED EMBODIMENT

The present invention relates to a signal line structure, and more particularly to a differential signal line structure. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

Figure 1:
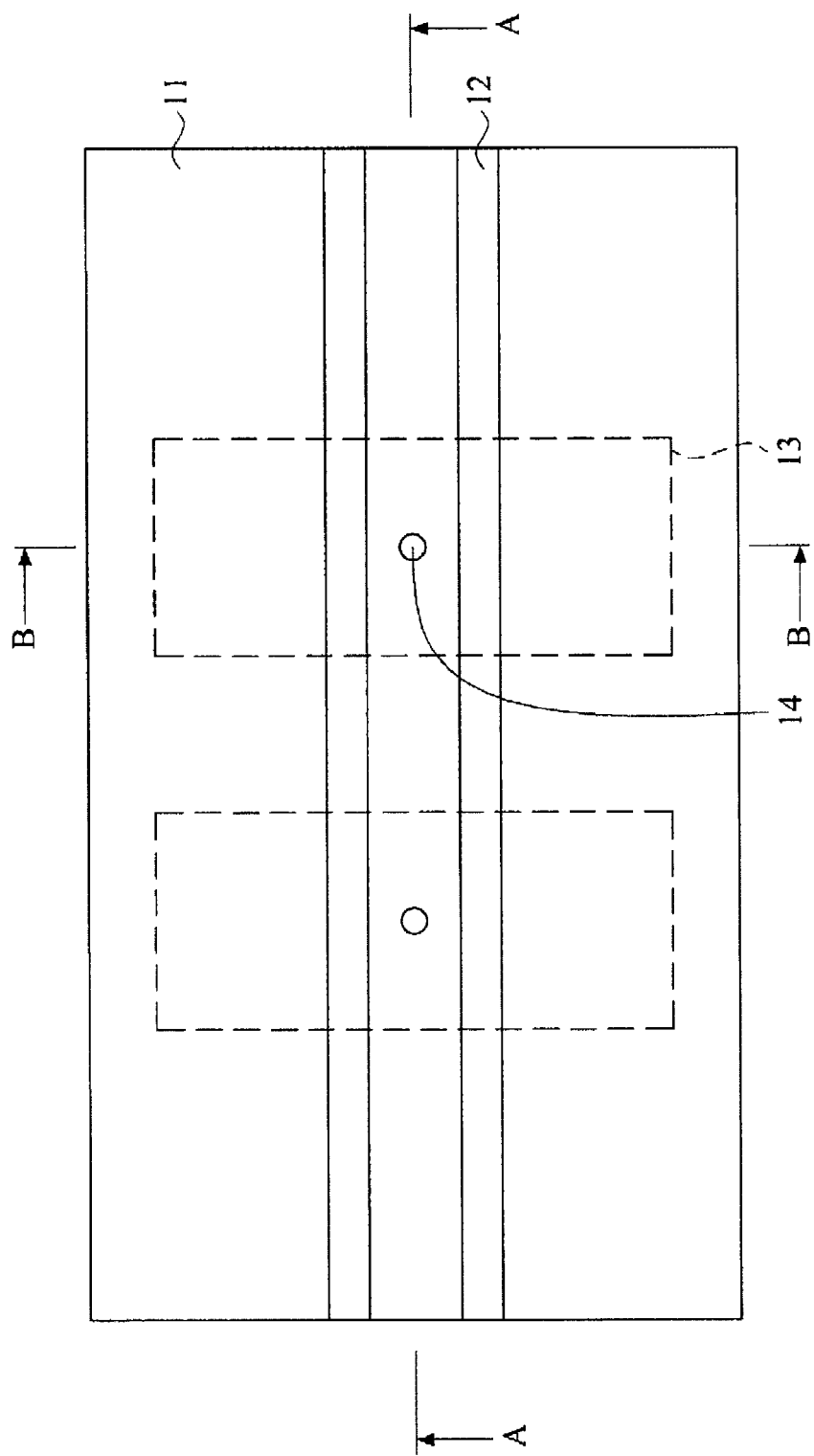
FIG. 1 is an upper view of a common mode filter realized with an EBG of a multi-layer substrate in the prior art.
Figure 2:
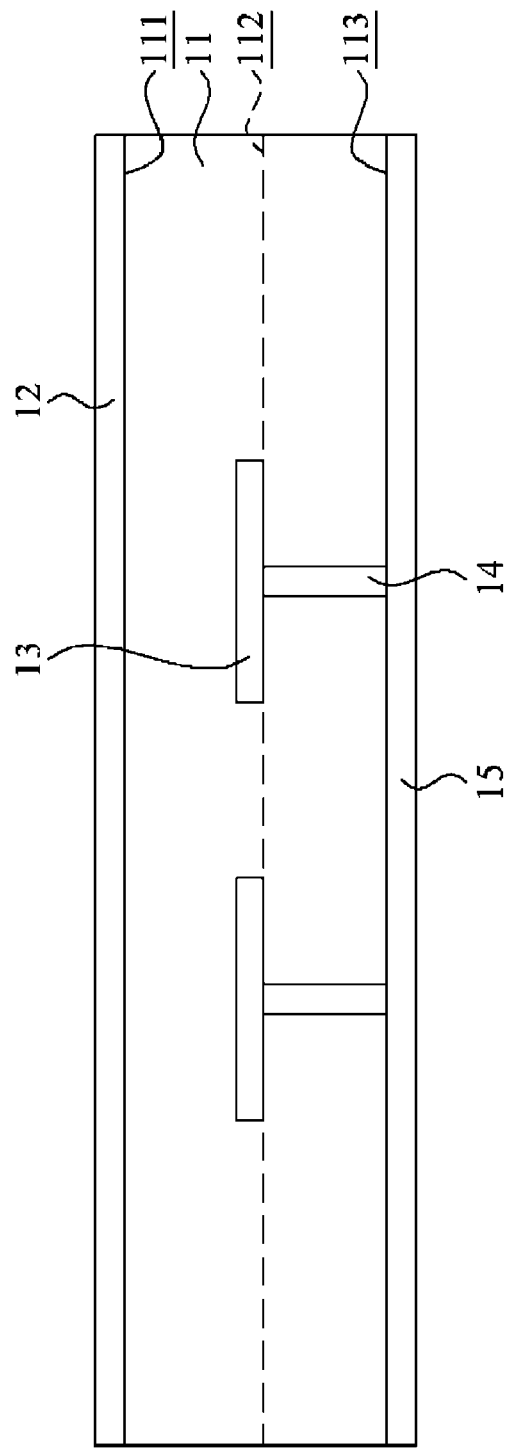
FIG. 2 is a cross-sectional view of a differential signal line structure in the prior art taken along the A-A line of FIG. 1.
Figure 3:
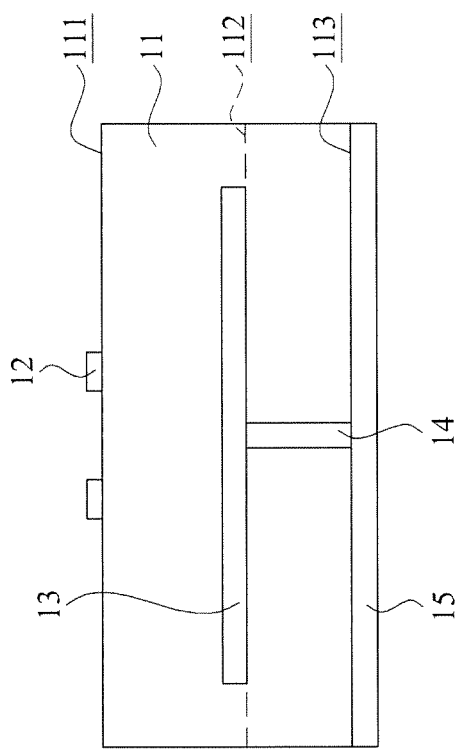
FIG. 3 is a cross-sectional view of the differential signal line structure in the prior art taken along the B-B line of FIG. 1.
Figure 4:
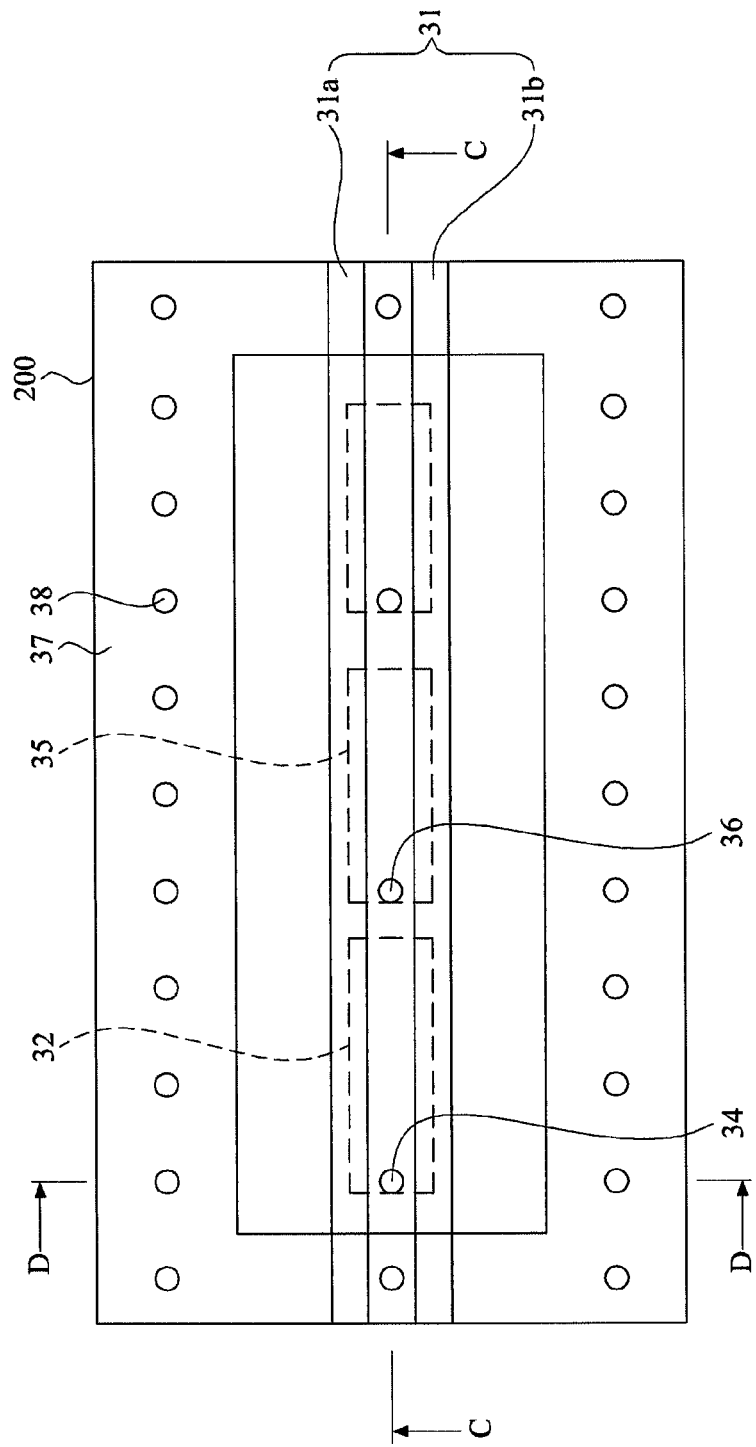
FIG. 4 is an upper view of an embodiment of a differential signal line structure of the present invention.
Figure 5:
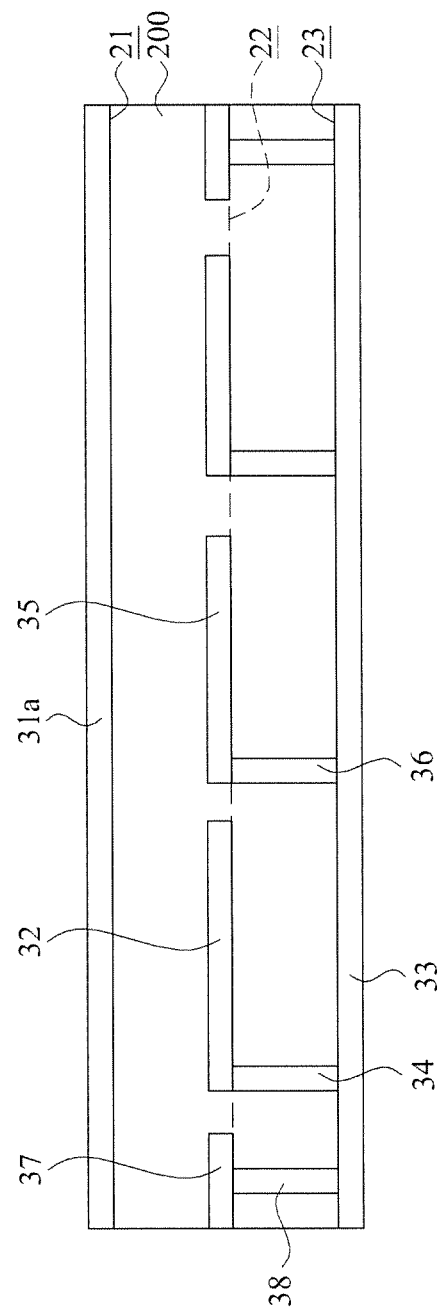
FIG. 5 is a cross-sectional view of the embodiment of the differential signal line structure of the present invention taken along the C-C line of FIG. 4.
Figure 6:
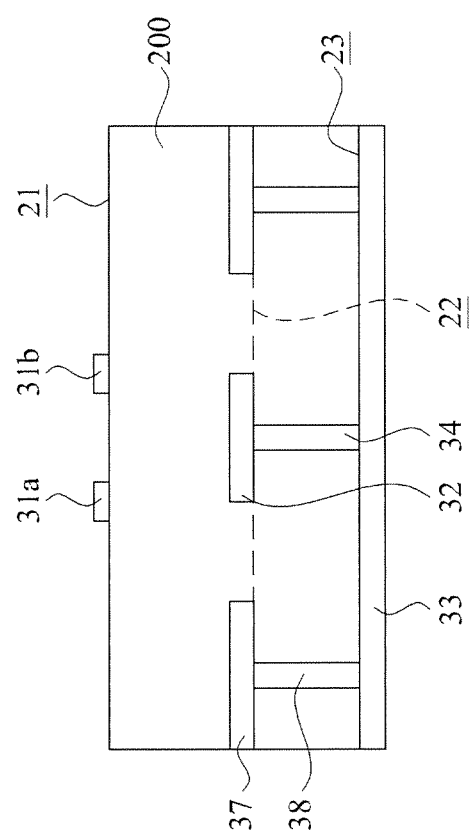
FIG. 6 is a cross-sectional view of the embodiment of the differential signal line structure of the present invention taken along the D-D line of FIG. 4.

Referring to FIGS. 4, 5 and 6, wherein FIG. 4 is an upper view of an embodiment of a differential signal line structure of the present invention; FIG. 5 is a cross-sectional view of the embodiment of the differential signal line structure of the present invention taken along the C-C line of FIG. 4; and FIG. 6 is a cross-sectional view of the embodiment of the differential signal line structure of the present invention taken along the D-D line of FIG. 4. The differential signal line structure of the present invention is disposed on a substrate 200, which includes a signal layer 21, a filter layer 22 and a grounding layer 23, wherein the signal layer 21, the filter layer 22 and the grounding layer 23 are arranged from up to down and in parallel.

The embodiment of the differential signal line structure of the present invention includes a differential signal line group 31, a first wire 32 and a first grounding circuit 33. The differential signal line group 31 is disposed in the signal layer 21, wherein the differential signal line group 31 includes a first signal line 31a and a second signal line 31b disposed in parallel manner.

The first wire 32 is disposed in the filter layer 22, wherein the first wire 32 is arranged in a corresponding position right underneath the differential signal line group 31. The first grounding circuit 33 is disposed in the grounding layer 23 and is electrically connected to an end point of the first wire 32 through a first via 34.

By means of the aforementioned structure, a quarter wavelength resonator is formed by the first wire 32 to reduce the common mode noise of the frequency corresponding to the wave-length. By presetting the frequency of the common mode noise to be reduced, the length of the first wire 32 and the height of the first via 34 are also determined. Regarding the conversion of length of a quarter wave-length resonator, no further description is provided since it is a common knowledge in the art.

According to an embodiment of the present invention, the differential signal line structure further includes a second wire 35 disposed in the filter layer 22 wherein the second wire 35 is arranged in a corresponding position right underneath the differential signal line group 31 and the second wire 35 is electrically connected to the first grounding circuit 33 through a second via 36 by an end point. The length of the second wire 35 can be the same as and can be different from the length of the first wire 32. When the first length of the second wire 35 is different from the length of the first wire 32, the second wire 35 reduces the common mode noise in different frequency from the common mode noise reduced by the first wire 32. As a result, the common mode noise is reduced in wider bandwidth. Accordingly, several wires with different lengths are disposed underneath the differential signal line group 31 according to the present invention so that a better effect of reducing the common mode noise is achieved. According to FIGS. 4, 5 and 6, which respectively show embodiments of the present invention, wherein wires in three different length are provided as examples.

Moreover, according to the present invention, the differential signal line structure further includes a second grounding circuit 37 disposed in the filter layer 22, wherein the second grounding circuit 37 is electrically connected to the first grounding circuit 33 at least through a third via 38. As a result, the effect of reducing the common mode noise is improved.

Figure 7:
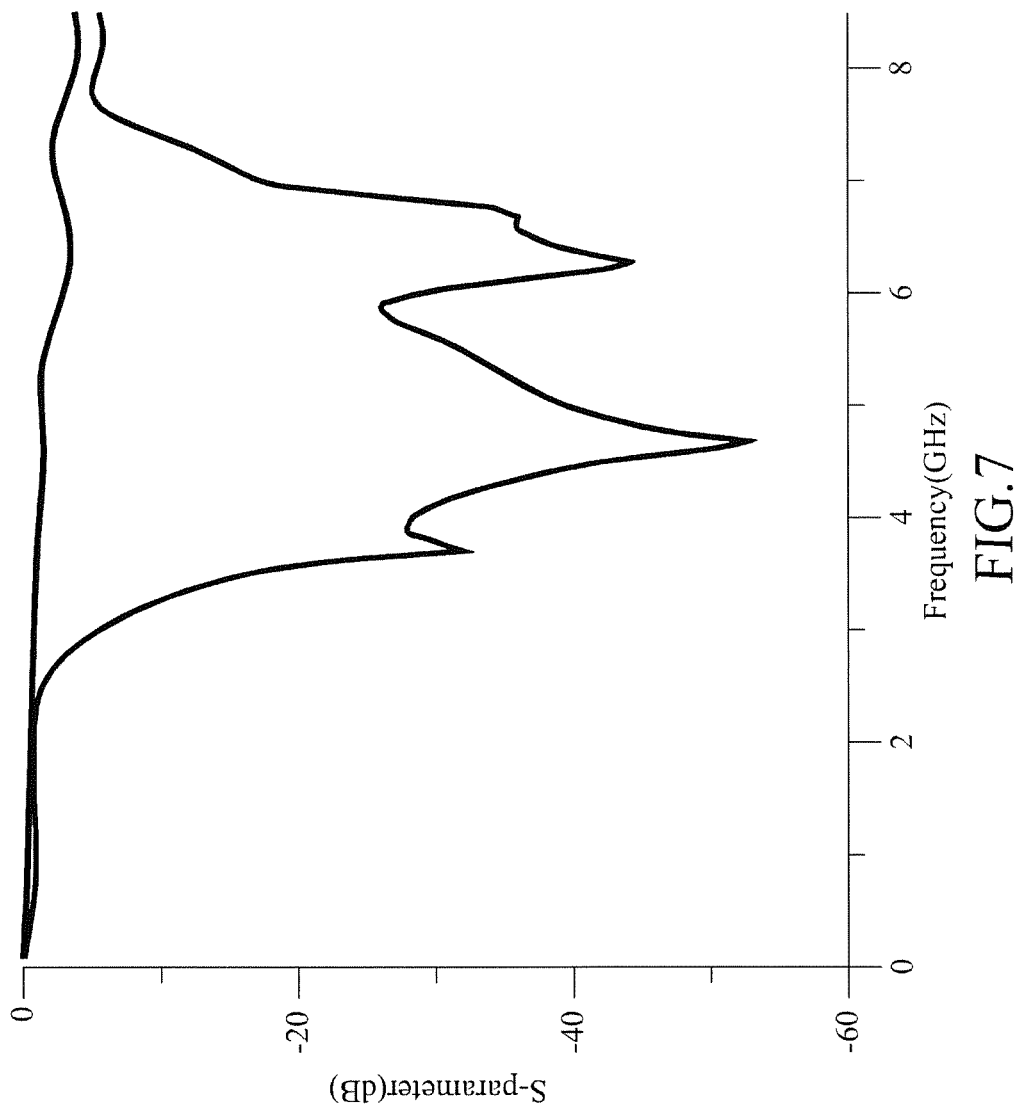
FIG. 7 is a figure showing the scattering parameter (S-parameter) of the differential signal line structure according to the present invention.

Referring to FIG. 7, FIG. 7 is a figure showing the scattering parameter (S-parameter) of the embodiment of the differential signal line structure according to the present invention. It is clear that the amount of the S-parameter is not affected by the first wire 32 and the second wire 35 while the S-parameter of the common mode is largely decreased due to the common mode filter formed by the first wire 32 and the second wire 35.

Figure 8A:
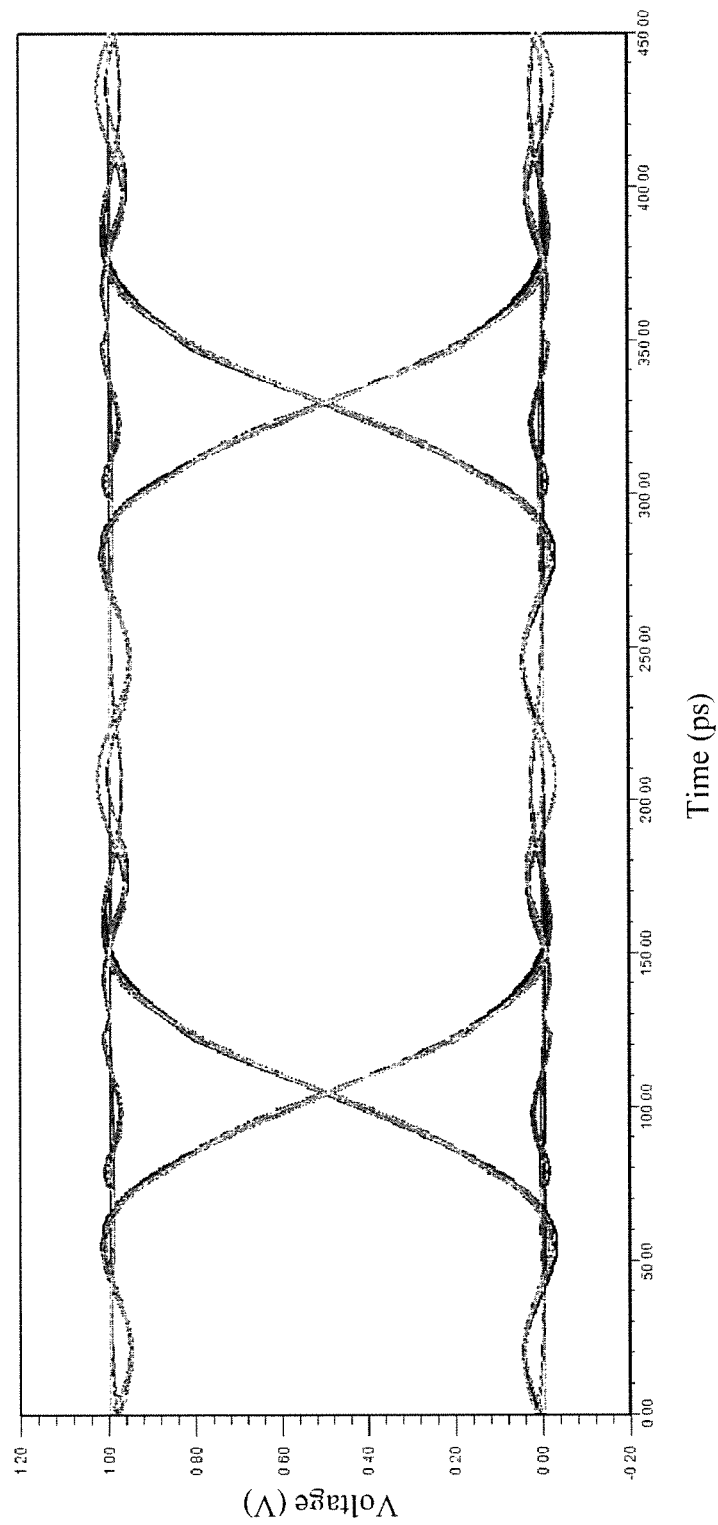
FIG. 8A is an output eye diagram of a differential signal line structure without a common mode filter in the prior art.
Figure 8B:
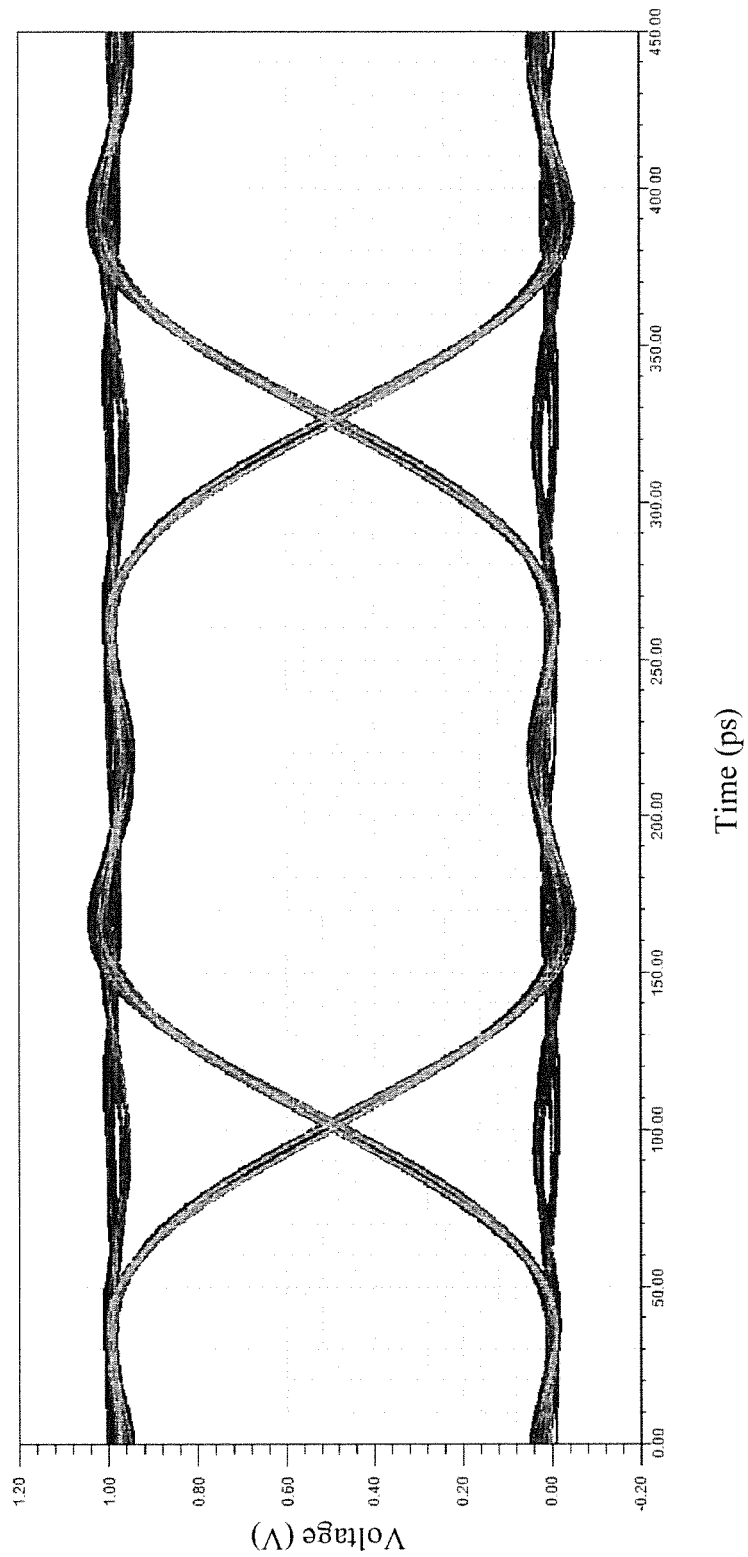
FIG. 8B is an output eye diagram of the embodiment a differential signal line structure of the present invention.

Referring to FIGS. 8A and 8B, wherein FIG. 8A is an output eye diagram of a differential signal line structure without a common mode filter in the prior art; and FIG. 8B is an output eye diagram of a differential signal line structure of an embodiment of the present invention. The abovementioned two eye diagrams are measured with an electronic measurement and simulation software, Advanced Design System (ADS) 2006, of the company of Agilent Technologies, Taipei, Taiwan. It is clear that the output eye diagram of the differential signal line structure of the present invention has better signal integrity than the output eye diagram of the differential signal line structure without a common mode filter in the prior art.

Figure 9:
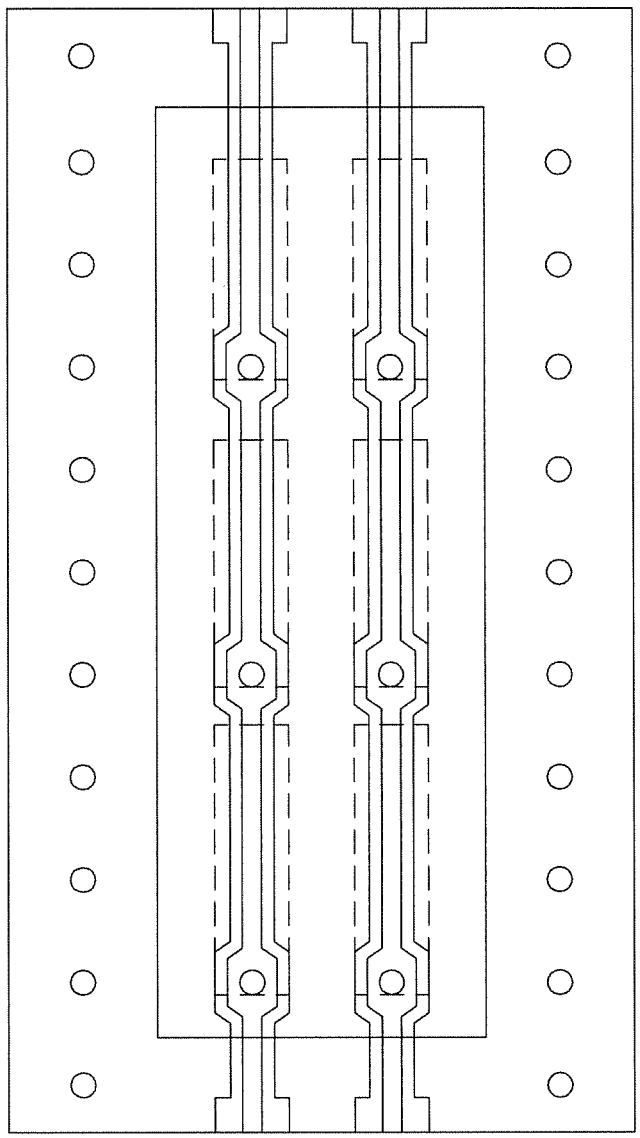
FIG. 9 is a schematic view showing a differential signal line structure of the present invention being utilized in multiple pairs of differential signal lines.

Referring to FIG. 9, FIG. 9 is a schematic view showing another embodiment of the differential signal line structure of the present invention being utilized in multiple pairs of differential signal lines. It is clear that the wires forming the common mode filter are in parallel with the position of the differential signal line group in the differential signal line structure of the present invention; therefore, the multiple pairs of differential signal lines are arranged to locate closely. Since a via usually goes through the whole circuit board, the differential signal line group merely needs to go through the via, and does not affect the reduction of the common mode noise.

In conclusion, compared with the differential signal line structure of the common mode filter realized with the EBG of the multi-layer substrate in the prior art, the differential signal line structure according to the present invention includes the first wire 32 connecting to the ground with an end disposed right underneath the differential signal line group 31 to form a quarter wave-length resonator and to reduce the common mode noise. Moreover, since the width of the first wire 32 is not a major parameter for reducing the common mode noise and the first wire 32 is arranged in parallel manner to the differential signal line group 31, the differential signal line structure of the present invention can be utilized in differential transmission lines arranged in multi-pairs and are located closely together and can provide great effect of reducing the common mode noise.

While the present invention has been particularly shown and described with reference to a preferred embodiment, it will be understood by those skilled in the art that various changes in form and detail may be without departing from the spirit and scope of the present invention.

What is claimed is:

1. A differential signal line structure disposed on a substrate including a signal layer, a filter layer and a grounding layer, wherein the signal layer, the filter layer and the grounding layer are arranged from up to down and in parallel, the differential signal line structure comprising:
- a differential signal line group disposed in the signal layer;
- a first wire disposed in the filter layer, wherein the first wire is arranged in a corresponding position right underneath the differential signal line group;
- a first grounding circuit disposed in the grounding layer, wherein the first grounding circuit is electrically connected to an end point of the first wire through a first via; and
- a second grounding circuit disposed in the filter layer, and electrically connected to the first grounding circuit.

2. The differential signal line structure according to claim 1, wherein the differential signal line group includes a first signal line and a second signal line in parallel.

3. The differential signal line structure according to claim 1, further comprising a second wire disposed in the filter layer, wherein the second wire is arranged in a corresponding position right underneath the differential signal line group and the second wire is electrically connected to the first grounding circuit through a second via by an end point.

4. The differential signal line structure according to claim 1, wherein the second grounding circuit is electrically connected to the first grounding circuit at least through a third via.

* * * * *